US011769773B2

(12) United States Patent
Matsusaki et al.

(10) Patent No.: US 11,769,773 B2
(45) Date of Patent: *Sep. 26, 2023

(54) DISPLAY DEVICE, ELECTRONIC DEVICE, AND METHOD OF MANUFACTURING DISPLAY DEVICE WITH SUBSTRATE INCLUDING LIGHT EMITTING ELEMENTS ADHERED TO SUBSTRATE INCLUDING MICROLENS ARRAY

(71) Applicant: Sony Semiconductor Solutions Corporation, Kanagawa (JP)

(72) Inventors: Koji Matsusaki, Kumamoto (JP); Yosuke Motoyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/317,313

(22) Filed: May 11, 2021

(65) Prior Publication Data

US 2021/0335831 A1 Oct. 28, 2021

Related U.S. Application Data

(63) Continuation of application No. 16/477,681, filed as application No. PCT/JP2017/044550 on Dec. 12, 2017, now Pat. No. 11,024,651.

(30) Foreign Application Priority Data

Jan. 20, 2017 (JP) ................................ 2017-008438

(51) Int. Cl.
*H01L 27/12* (2006.01)
*H01L 27/146* (2006.01)
(Continued)

(52) U.S. Cl.
CPC .... *H01L 27/1214* (2013.01); *H01L 27/14627* (2013.01); *H10K 50/84* (2023.02); *H10K 59/38* (2023.02)

(58) Field of Classification Search
CPC . H01L 33/58; H01L 51/5246; H01L 51/5275; H01L 27/1214; H01L 27/14627;
(Continued)

(56) References Cited

U.S. PATENT DOCUMENTS 9,496,523 B1  11/2016  Xiang
2002/0130990 A1  9/2002  Nakamura
(Continued)

FOREIGN PATENT DOCUMENTS

CN  1575056 A  2/2005
CN  1737650 A  2/2006
(Continued)

OTHER PUBLICATIONS

Chinese Office Action dated Jul. 5, 2021 for corresponding Chinese Application No. 2017800833727.
(Continued)

*Primary Examiner* — Mohammad M Hoque
(74) *Attorney, Agent, or Firm* — Michael Best & Friedrich LLP

(57) ABSTRACT

There is provided a display device including: a first substrate that is a silicon substrate and on which a plurality of light-emitting elements is formed; a second substrate including, on a surface, a color filter layer including a plurality of color filters arrayed and a microlens layer including a plurality of microlenses arrayed that are layered in this order, the microlens layer being arranged to face the plurality of light-emitting elements with respect to the first substrate; and an adhesive layer that fills a gap between the first
(Continued)

substrate and the second substrate for bonding the first substrate and the second substrate together.

16 Claims, 12 Drawing Sheets

(51) Int. Cl.
*H10K 50/84* (2023.01)
*H10K 59/38* (2023.01)

(58) Field of Classification Search
CPC ... H01L 27/322; H01L 51/5237; H01L 51/50; H05B 33/02; H05B 33/10; H05B 33/12; G02B 3/00; G02B 5/20; G09F 9/30; H10K 50/84; H10K 59/38; H10K 50/858
USPC .......................................................... 257/40
See application file for complete search history.

(56) References Cited

U.S. PATENT DOCUMENTS

| | | |
|---|---|---|
| 2005/0106776 A1 | 5/2005 | Yotsuya |
| 2006/0038953 A1 | 2/2006 | Moriya |
| 2007/0064469 A1 | 3/2007 | Umezaki |
| 2007/0257250 A1 | 11/2007 | Tseng et al. |
| 2008/0037084 A1 | 2/2008 | Kobayashi |
| 2008/0086433 A1 | 4/2008 | Schmdtler et al. |
| 2011/0102308 A1 | 5/2011 | Nakamura et al. |
| 2011/0175118 A1 | 7/2011 | Hori et al. |
| 2014/0178634 A1 | 6/2014 | Sugishima |
| 2015/0084026 A1 | 3/2015 | Miyamoto et al. |
| 2016/0043145 A1 | 2/2016 | Choi et al. |
| 2016/0079333 A1 | 3/2016 | Shishido et al. |
| 2021/0013453 A1 | 1/2021 | Matsuda et al. |

FOREIGN PATENT DOCUMENTS

| | | |
|---|---|---|
| CN | 1985196 A | 6/2007 |
| CN | 101068026 A | 11/2007 |
| CN | 101989609 A | 3/2011 |
| CN | 102159972 A | 8/2011 |
| CN | 102683602 A | 9/2012 |
| CN | 102820433 A | 12/2012 |
| CN | 103026526 A | 4/2013 |
| CN | 103137890 A | 6/2013 |
| CN | 103579520 A | 2/2014 |
| CN | 105556672 A | 5/2016 |
| EP | 1484946 A2 | 12/2004 |
| EP | 1770416 A1 | 4/2007 |
| JP | 2004363049 A | 12/2004 |
| JP | 2006-058604 A | 3/2006 |
| JP | 2007-300087 A | 11/2007 |
| JP | 2013064988 A | 4/2013 |
| JP | 2013064998 A | 4/2013 |
| JP | 2014-038782 A | 2/2014 |
| JP | 2014089408 A | 5/2014 |
| JP | 2014-120433 A | 6/2014 |
| JP | 2015-069700 A | 4/2015 |
| JP | 2016-022416 A | 2/2016 |
| JP | 2016-027426 A | 2/2016 |
| KR | 20040108606 A | 12/2004 |
| KR | 20060053837 A | 5/2006 |
| KR | 20070039539 A | 4/2007 |
| KR | 20180076597 A * | 12/2016 |
| TW | 200511893 | 3/2005 |
| TW | 200613773 | 5/2006 |
| TW | 201603258 A | 1/2016 |
| WO | 2006/009009 A1 | 1/2006 |
| WO | 2010/035678 A1 | 4/2010 |
| WO | WO-2013032039 A1 | 3/2013 |
| WO | 2016/038508 A1 | 3/2016 |
| WO | 2016/125792 A1 | 8/2016 |

OTHER PUBLICATIONS

Japanese Office Action dated Aug. 31, 2021 for corresponding Japanese Application No. 2018-563217.

* cited by examiner

DISPLAY DEVICE, ELECTRONIC DEVICE, AND METHOD OF MANUFACTURING DISPLAY DEVICE WITH SUBSTRATE INCLUDING LIGHT EMITTING ELEMENTS ADHERED TO SUBSTRATE INCLUDING MICROLENS ARRAY

CROSS REFERENCES TO RELATED APPLICATIONS

The present Application is a Continuation Application of U.S. patent application Ser. No. 16/477,681 filed Jul. 12, 2019, which is a 371 National Stage Entry of International Application No.: PCT/JP2017/044550, filed on Dec. 12, 2017, which in turn claims priority from Japanese Application No. 2017-008438, filed on Jan. 20, 2017, the entire contents of which are incorporated herein by reference.

TECHNICAL FIELD

The present disclosure relates to a display device, an electronic device, and a method of manufacturing a display device.

BACKGROUND ART

In a display device, to improve light extraction efficiency, a structure has been devised in which a microlens (ML) is provided for each pixel in its light emission direction. For example, Patent Documents 1 and 2 disclose an organic electroluminescence (EL) display device in which an ML is provided for each pixel, the organic EL display device being produced by bonding, to a first substrate on which a plurality of light-emitting elements is formed, a second substrate on which a plurality of the MLs is formed on a surface thereof such that the plurality of MLs faces the plurality of light-emitting elements.

CITATION LIST

Patent Document

Patent Document 1: Japanese Patent Application Laid-Open No. 2014-120433
Patent Document 2: Japanese Patent Application Laid-Open No. 2015-69700

SUMMARY OF THE INVENTION

Problems to be Solved by the Invention

In recent years, development has been actively conducted of an ultra-small display device (also referred to as a microdisplay) mounted on electronic devices, for example, a head mounted display (HMD), an electronic view finder (EVF) of a digital camera, and the like. In such an ultra-small display device, to obtain a desired luminance, it is required to further improve the light extraction efficiency as compared with a larger display device. Thus, it is considered that the above-described configuration in which the ML is provided for each pixel is particularly effective in such an ultra-small display device.

However, the technologies described in Patent Documents 1 and 2 above are considered to be intended for a medium display device mounted on electronic devices, for example, a smartphone, a tablet personal computer (PC), and the like, and it is not intended for the ultra-small display device. Thus, even if the technologies described in Patent Documents 1 and 2 above are applied as they are to an ultra-small display device, there is a possibility that the light extraction efficiency cannot be effectively improved.

The present disclosure therefore devises a novel and improved display device, an electronic device, and a method of manufacturing a display device capable of further improving the light extraction efficiency.

Solutions to Problems

According to the present disclosure, there is provided a display device including: a first substrate that is a silicon substrate and on which a plurality of light-emitting elements is formed; a second substrate including, on a surface, a color filter layer including a plurality of color filters arrayed and a microlens layer including a plurality of microlenses arrayed that are layered in this order, the microlens layer being arranged to face the plurality of light-emitting elements with respect to the first substrate; and an adhesive layer that fills a gap between the first substrate and the second substrate for bonding the first substrate and the second substrate together.

According to the present disclosure, there is provided an electronic device including a display device that performs display on the basis of an image signal, in which the display device includes: a first substrate that is a silicon substrate and on which a plurality of light-emitting elements is formed; a second substrate including, on a surface, a color filter layer including a plurality of color filters arrayed and a microlens layer including a plurality of microlenses arrayed that are layered in this order, the microlens layer being arranged to face the plurality of light-emitting elements with respect to the first substrate; and an adhesive layer that fills a gap between the first substrate and the second substrate for bonding the first substrate and the second substrate together.

Furthermore, according to the present disclosure, there is provided a method of manufacturing a display device, including: forming a plurality of light-emitting elements on a first substrate that is a silicon substrate; layering, on a second substrate, a color filter layer including a plurality of color filters arrayed and a microlens layer including a plurality of microlenses arrayed, in this order; and bonding the first substrate and the second substrate together to cause the microlens layer to face the plurality of light-emitting elements.

According to the present disclosure, a facing CF type display device is provided. To cope with miniaturization, a silicon substrate is used as the first substrate. Furthermore, in the display device, the MLs are formed on the second substrate before the first substrate on the light-emitting element side and the second substrate on the CF side are bonded together. As a result, there is no need to consider influence of heat or the like on the light-emitting elements, and an existing technology can be applied as it is to a step of forming the MLs. As described above, according to the present disclosure, in a display device capable of coping with miniaturization, the MLs can be formed without a significant increase in development cost, and the light extraction efficiency can be improved.

Effects of the Invention

As described above, according to the present disclosure, the light extraction efficiency can be further improved. Note that, the above-described effect is not necessarily limited, and, in addition to the above effect, or in place of the above effect, any of effects described in this specification, or other effects that can be grasped from the present specification may be exhibited.

MODE FOR CARRYING OUT THE INVENTION

Figure 1:
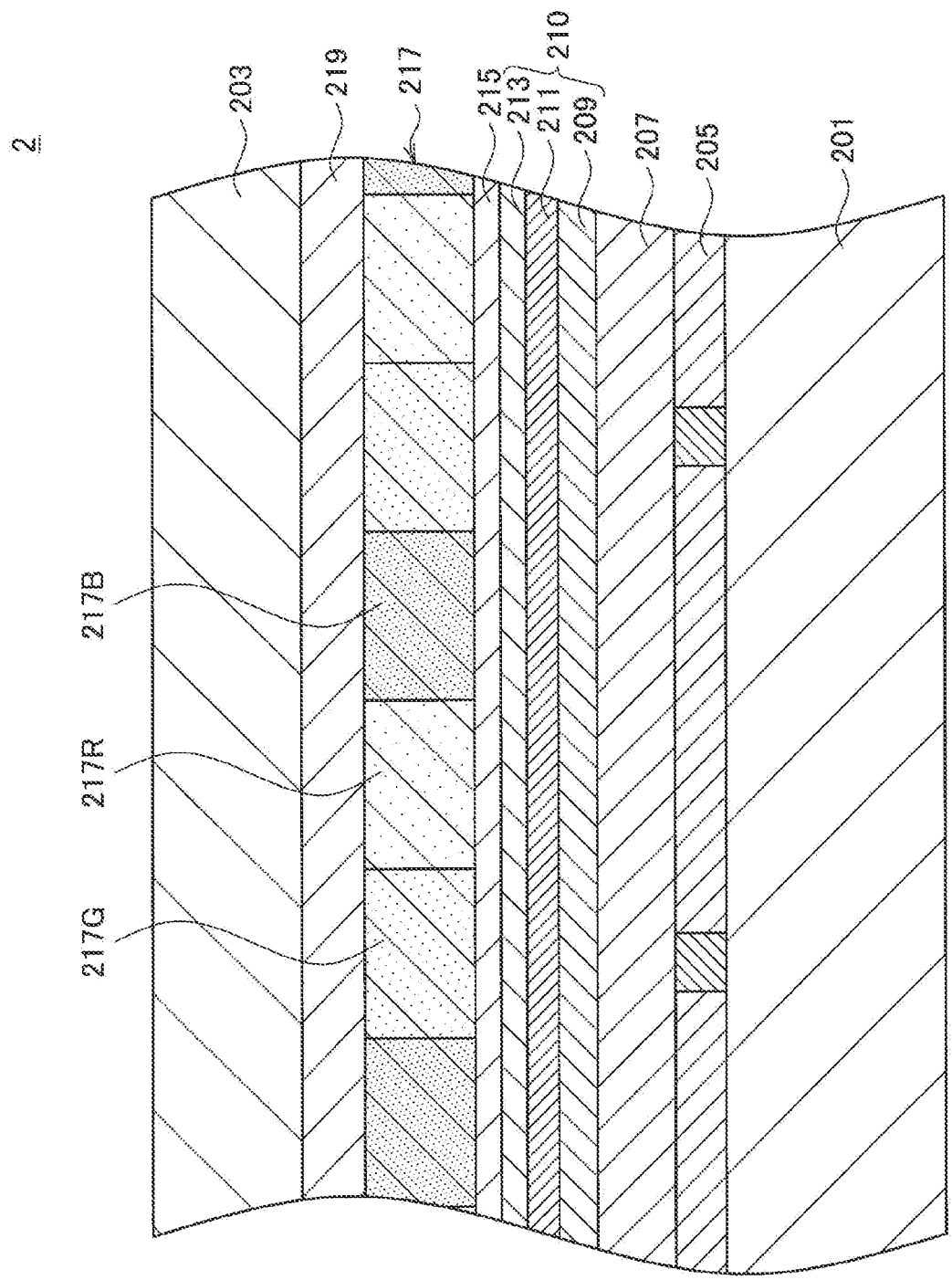
FIG. 1 is a diagram illustrating a configuration of a general OCCF type organic EL microdisplay.

Preferred embodiments of the present disclosure will be described in detail below with reference to the accompanying drawings. Note that, in the present specification and the drawings, constituents having substantially the same functional configuration are denoted by the same reference signs, and redundant explanations are omitted.

Note that, in this specification, in a case where it is described that a certain layer and another layer are layered, the expression may mean a state in which these layers are layered in direct contact with each other, and may also mean a state in which these layers are layered with another layer interposed therebetween.

Note that, a technology according to the present disclosure can be suitably applied to a display device having a size smaller than a medium size (a so-called small display device, and an ultra-small display device) among display devices. Thus, in the following description, an embodiment of the present disclosure will be described taking the ultra-small display device as an example.

Here, in this specification, the ultra-small display device means a display device having a panel size of about 0.2 inches to about 2 inches, for example. A pixel size of the ultra-small display device may be, for example, equal to or less than about 20 µm. As described above, the ultra-small display device can be suitably mounted on, for example, an HMD, an EVF, or the like. Furthermore, the small display device means a display device having a panel size of about 2 inches to about 7 inches, for example. A pixel size of the small display device may be, for example, from about 30 µm to 70 µm. Furthermore, in the present specification, a medium display device means a display device having a panel size of about 7 inches to about 15 inches, for example. A pixel size of the medium display device may be, for example, from about 50 µm to about 100 µm. A small or medium display device can be suitably mounted on, for example, a smartphone, a tablet PC, or the like.

Furthermore, in the following description, an organic EL display device will be described as an example. Note that, an ultra-small organic EL display device is also referred to as an organic EL microdisplay, an organic light emitting diode (OLED) microdisplay (MOLED), or the like. However, the present disclosure is not limited to such an example, and the technology according to the present disclosure may be applied to another type of display device as long as the display device has a configuration in which a CF can be arranged for each pixel.

Note that, the description will be made in the following order.

1. Background where the present disclosure has been conceived
2. Configuration of display device
3. Method of forming ML layer
4. Confirmation of effect
4-1. Relationship between ML thickness and light extraction efficiency
4-2. Relationship between gap between MLs and light extraction efficiency
5. Application examples
6. Supplement 1. Background where the Present Disclosure has been Conceived Prior to description of a preferred embodiment of the present disclosure, a background will be described where the present inventors have conceived the present disclosure.

As described above, in recent years, development has been actively conducted of the ultra-small display device mounted on, for example, the HMD, the EVF, or the like. Above all, the organic EL display device can implement high contrast and high speed response as compared with a liquid crystal display device, so that the organic EL display device (organic EL microdisplay) has attracted attention, as the ultra-small display device mounted on such electronic devices.

In the organic EL microdisplay, miniaturization of the pixel size has been progressed to obtain further high definition, and it is strongly required to improve the light extraction efficiency to achieve a desired luminance. Here, for example, Patent Documents 1 and 2 describe a configuration in which an ML is provided immediately above a light-emitting element in an organic EL display device. The technologies described in Patent Documents 1 and 2 are considered to be for a medium display device; however, there is a possibility that the light extraction efficiency can be improved by application of the technology to the organic EL microdisplay. Furthermore, by providing the ML, leakage of light into adjacent pixels can be suppressed, in other words, occurrence of color mixing can also be suppressed.

On the other hand, in the organic EL microdisplay, there are a method of emitting, for example, each color of RGB by a light-emitting element (so-called RGB coloring method), and a method in which a light-emitting element emits white light and a color filter (CF) is used to implement emission of, for example, each color of RGB. Moreover, as the latter organic EL microdisplay having the CF, a mainstream is the one produced by an on chip color filter (OCCF) method in which the CF is contiguously formed on a substrate on which a light-emitting element, a drive circuit of the light-emitting element, and the like are formed.

With reference to FIG. 1, a configuration will be described of a general organic EL microdisplay (hereinafter also referred to as an OCCF type organic EL microdisplay) produced by the OCCF method. FIG. 1 is a diagram illustrating a configuration of the general OCCF type organic EL microdisplay. FIG. 1 schematically illustrates a state of a cross section parallel to a layering direction (vertical direction) of the OCCF type organic EL microdisplay. Furthermore, the display device illustrated in FIG. 1 is a top emission type organic EL microdisplay.

As illustrated in FIG. 1, a display device 2 that is an OCCF type organic EL microdisplay includes a first substrate 201 on which a plurality of light-emitting elements (organic EL elements) each including an OLED and emitting white light is formed and a second substrate 203 that are bonded together.

The first substrate 201 includes, for example, glass, resin, or the like. On the first substrate 201, a drive circuit layer 205 is formed including a drive circuit for driving the light-emitting elements.

Then, on the drive circuit, a light-emitting element layer 210 including the plurality of light-emitting elements arrayed is formed with an insulating layer 207 interposed therebetween. Specifically, on the insulating layer 207, a first electrode 209 that functions as an anode, an organic layer 211 including an organic light-emitting material, and a second electrode 213 that functions as a cathode are layered in this order. For simplicity, although not illustrated, the first electrode 209 is patterned to be isolated from each other to correspond to each pixel. A layered structure of the first electrode 209, the organic layer 211, and the second electrode 213 in a portion corresponding to each isolated pattern can correspond to one light-emitting element (in other words, one pixel). For each pattern of the first electrode 209, the drive circuit is appropriately connected through a via (not illustrated) provided in the insulating layer 207, and the drive circuit appropriately applies a voltage to the first electrode 209, whereby each light-emitting element can be driven.

Note that, as described above, one pixel can be formed by one light-emitting element; however, actually, in the display device 2, one sub-pixel corresponding to any color is formed by one light-emitting element, and one pixel can be formed by a plurality of the sub-pixels corresponding to each color. However, in the present specification, for convenience for explanation, a light-emitting unit including one light-emitting element will be simply referred to as a pixel.

On the second electrode 213, a protective film 215 including resin or the like is layered. Then, a CF layer 217 is formed on the protective film 215. In the CF layer 217, any of CFs of respective colors of RGB (a red CF 217R, a green CF 217G, and a blue CF 217B) is formed corresponding to each light-emitting element.

The second substrate 203 is bonded to the CF layer 217 with a sealing resin film 219 including resin or the like interposed therebetween, whereby the display device 2 is produced.

In a case where the ML is to be mounted on the display device 2 that is the OCCF type organic EL microdisplay as described above, a step of forming the ML is added before the CF layer 217 is formed or after the CF layer 217 is formed on the first substrate 201.

Here, in image sensors, it is widely practiced to form the ML immediately above a photodiode (PD) to improve light collection efficiency on the PD.

Specifically, as a method of forming the ML on a substrate in an image sensor, a method is generally used of processing a lens material patterned by photolithography technology into a spherical shape by a reflow step. If it is possible to apply the method of forming the ML in such an image sensor to the step of forming the ML in the display device 2, it is not necessary to newly develop a process, so that it is useful from a viewpoint of reduction of development cost.

However, in the display device 2 that is the OCCF type organic EL microdisplay, in a case where the ML is to be formed by the method used in the above-described image sensor, problems below may occur.

First, the first problem is that there is a possibility that characteristics of the light-emitting elements are degraded by the reflow step. For example, there is a possibility that an organic EL element that is a light-emitting element does not operate properly any longer if exposed to a high temperature, and it is generally required to suppress the temperature at lower than about 100° C. in a step performed after formation of the organic EL element. However, in a process generally used for the image sensor, a reflow temperature during ML formation is from about 100° C. to 250° C. Thus, when the ML is formed by performing reflow at such a high temperature, there is a possibility that characteristics of the organic EL element is degraded.

Next, the second problem is that it is difficult to make the shape of the ML into a concave lens shape. Note that, in this specification, regarding the shape of the ML, the shape of the lens protruding toward the light-emitting element is referred to as a concave lens shape, and the shape of the lens protruding toward an opposite side to the light-emitting element (in other words, a light emission direction side) is referred to as a convex lens shape.

In general, silicon nitride (SiN) is often used as the protective film 215, and its refractive index is about 2.0. On the other hand, the refractive index of the lens material that is a material of the ML may be from about 2.0 to 3.0, for example, when a material generally used for the ML of the image sensor is assumed. As described above, when the general material is assumed, the refractive index of the protective film 215 becomes smaller than the refractive index of the ML, so that the shape of ML is preferably set to a concave lens shape to efficiently collect the emitted light from the light-emitting element.

However, in a case where the ML is formed on the substrate by using the above-described method used for the image sensor, the shape of the ML becomes a lens shape protruding to an opposite side to the substrate side. That is, in the display device 2, in a case where the ML is formed on the first substrate 201 by using the existing method used for the image sensor as it is, the shape of the ML becomes a convex lens shape. Thus, it is impossible to efficiently collect the emitted light from the light-emitting element. If a magnitude relationship can be reversed between the refractive indexes of the material of the protective film 215 and the material of the ML, even if the shape of the ML is a convex lens shape, it is possible to collect the light efficiently; however, newly developing such a protective film 215 and the ML causes an increase in the development cost, and is not preferable.

As described above, from a viewpoint of protecting the organic EL element from the high temperature at the time of reflow, and from a viewpoint of the lens shape of the ML, in a case where the ML is to be mounted on the display device 2, it is difficult to use the existing method used for the image sensor as it is. As described above, in a case where the ML is to be formed for the OCCF type organic EL microdisplay, it becomes necessary to newly develop a process for forming the ML, or newly develop a material for the ML, so that there is a possibility that the increase in the development cost is caused. Note that, for the CF layer 217, similarly, when the CF layer 217 is to be formed by using the existing method used for the image sensor as it is, the organic EL element is exposed to the high temperature, so that, for the OCCF type organic EL microdisplay, it may become necessary to newly develop a process also for forming the CF layer 217.

As described above, it has been difficult to say that a method of mounting the ML on the organic EL microdisplay has been sufficiently studied so far. In view of such circumstances, as a result of conduction of intensive studies on the method of mounting the ML on the organic EL microdisplay, the present inventors have conceived the present disclosure. According to the present disclosure, the ML can be more suitably formed, in the organic EL microdisplay. As a result, the organic EL microdisplay with higher light extraction efficiency can be implemented. Hereinafter, a preferred embodiment will be described of the present disclosure conceived by the present inventors.

2. Configuration of Display Device

Figure 2:
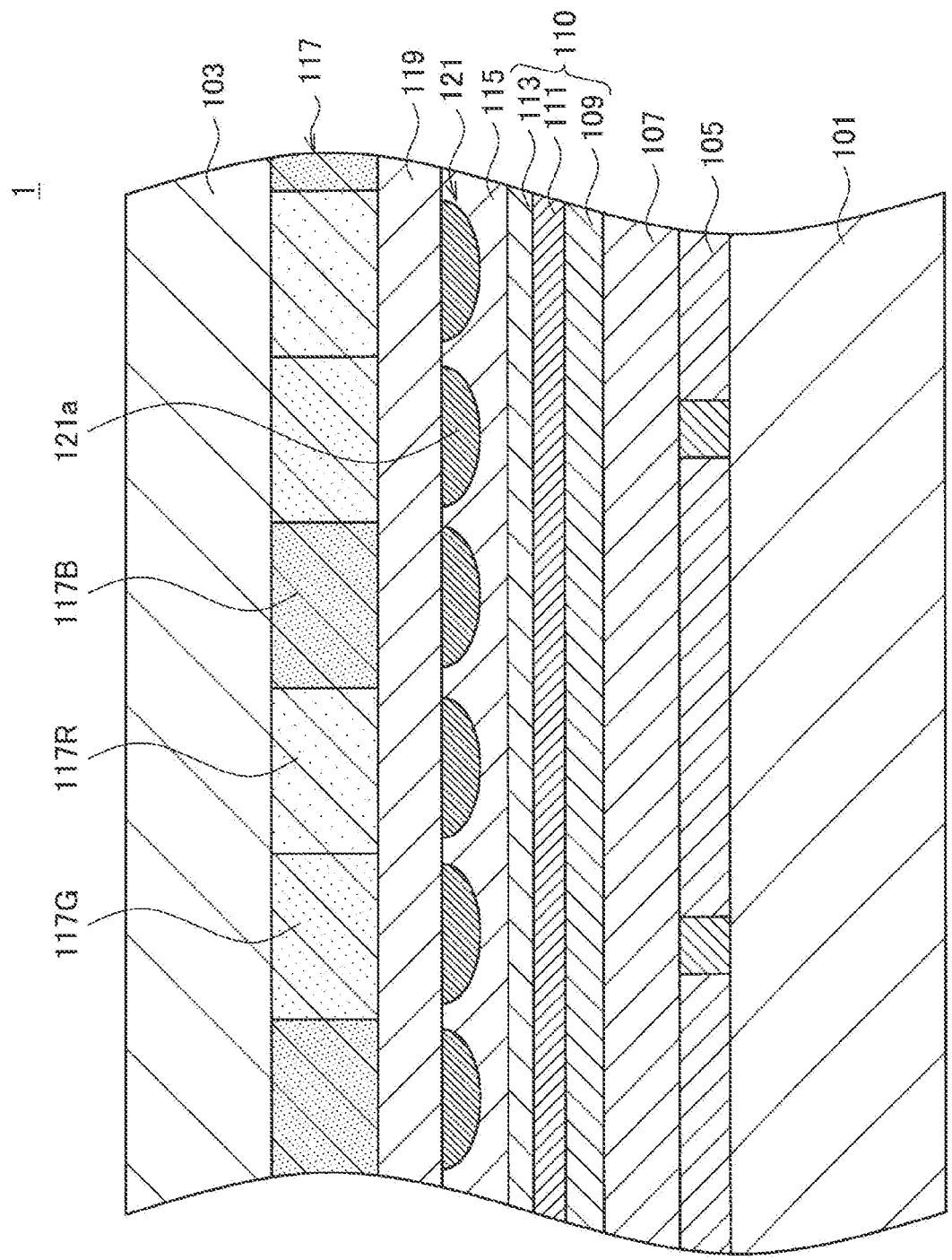
FIG. 2 is a diagram illustrating a configuration of a display device according to the present embodiment.

With reference to FIG. 2, a configuration will be described of a display device according to an embodiment of the present disclosure. FIG. 2 is a diagram illustrating the configuration of the display device according to the present embodiment. FIG. 2 schematically illustrates a state of a cross section parallel to a layering direction (vertical direction) of the display device according to the present embodiment. Furthermore, the display device illustrated in FIG. 2 is a top emission type display device.

Referring to FIG. 2, the display device 1 according to the present embodiment mainly includes: a first substrate 101; a light-emitting element layer 110 that is formed on the first substrate 101 and on which a plurality of light-emitting elements each including an OLED and emitting white light is formed; an ML layer 121 provided above the light-emitting element layer 110 and including a plurality of MLs 121a arrayed; a CF layer 117 provided above the ML layer 121 and including a plurality of CFs 117R, 117B, and 117G arrayed; and a second substrate 103 provided above the CF layer 117 and including a material transparent to light from the plurality of light-emitting elements.

Here, in the present embodiment, to the first substrate 101 on which the light-emitting element layer 110 is formed, the second substrate 103 in which the CF layer 117 and the ML layer 121 are layered in this order on the surface is bonded, whereby the display device 1 is produced. That is, the display device 1 is an organic EL microdisplay (also referred to as a facing CF type organic EL microdisplay) produced by a facing CF method. For example, a panel size of the display device 1 may be from about 0.2 inches to about 2 inches. Furthermore, for example, a pixel size of the display device 1 may be equal to or less than about 20 μm.

Figure 3:
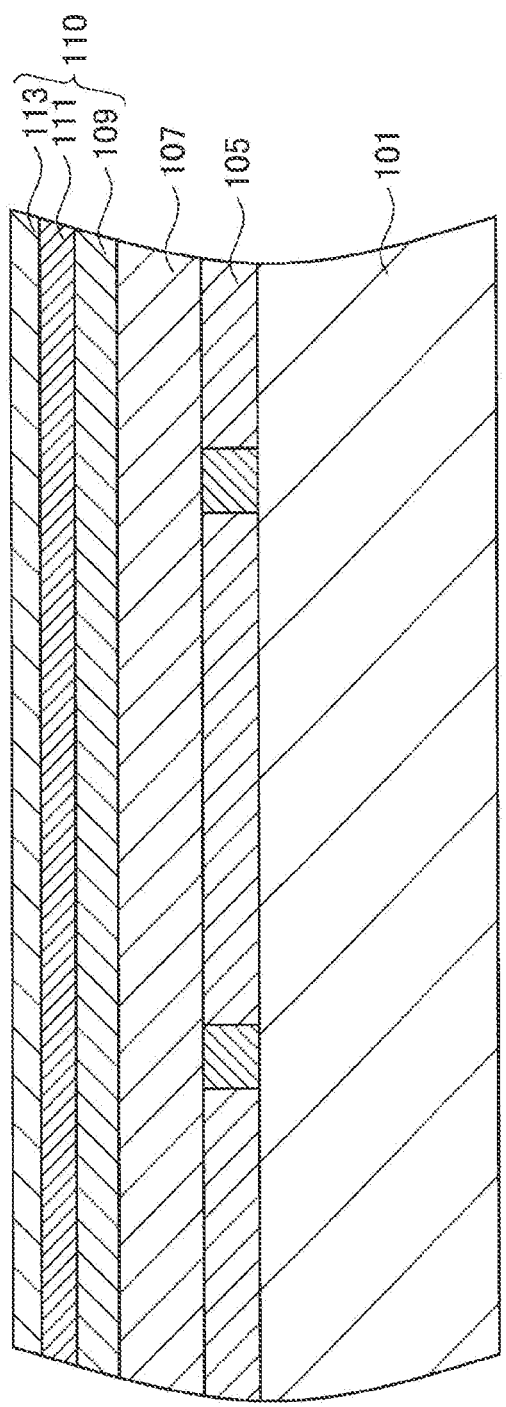
FIG. 3 is a diagram illustrating a configuration of a first substrate immediately before a step of being bonded, in the display device according to the present embodiment.
Figure 4:
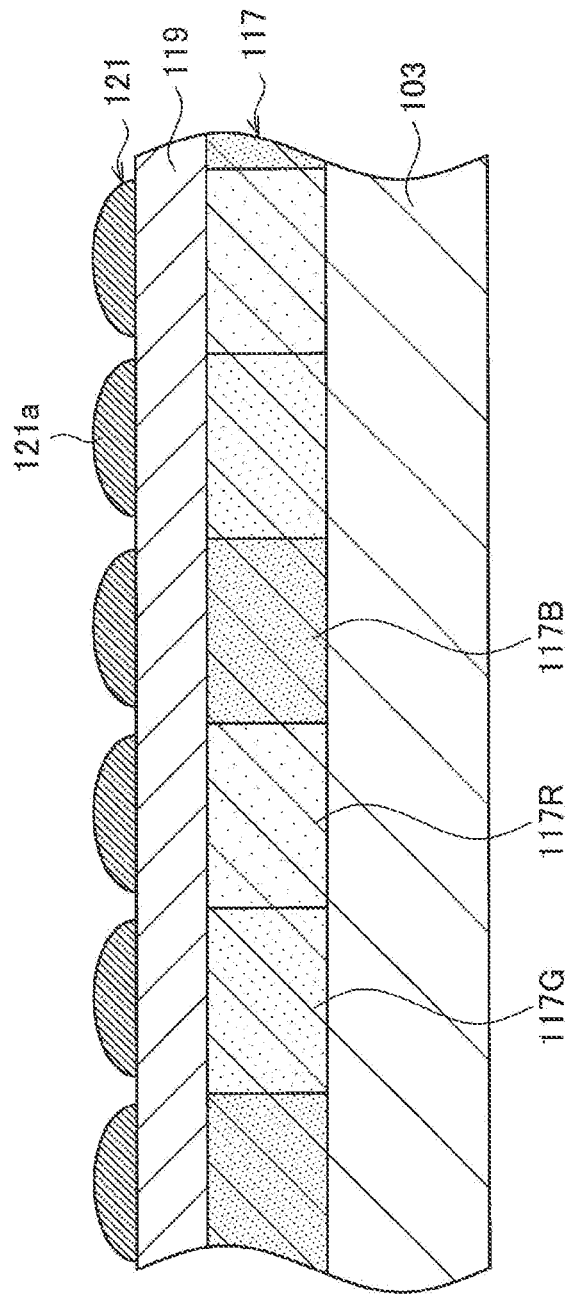
FIG. 4 is a diagram illustrating a configuration of a second substrate immediately before the step of being bonded, in the display device according to the present embodiment.

Here, FIG. 3 is a diagram illustrating a configuration of the first substrate 101 immediately before a step of being bonded, in the display device 1 according to the present embodiment, and FIG. 4 is a diagram illustrating a configuration of the second substrate 103 immediately before the step of being bonded, in the display device 1 according to the present embodiment. Hereinafter, the configurations will be described in order of the first substrate 101 and the second substrate 103, with reference to FIGS. 3 and 4.

(Configuration of First Substrate) The first substrate 101 includes silicon. On the first substrate 101, a drive circuit layer 105 is formed including a drive circuit for driving the light-emitting elements of the light-emitting element layer 110. The drive circuit includes, for example, a thin film transistor (TFT) and the like.

Here, in general, in an organic EL display device of a medium size or larger size, a glass substrate, a resin substrate, or the like is often used as the first substrate on which the light-emitting elements are formed. On the other hand, as described above, in the organic EL microdisplay, the miniaturization of the pixel size has been progressed to obtain further high definition, and along with this, the size of the TFT constituting the drive circuit, a wiring pitch of a wiring layer, and the like are also being miniaturized. In a case where the glass substrate or the resin substrate is used, fine processing required for such a high-definition organic EL microdisplay is difficult.

On the other hand, according to the present embodiment, by using a silicon substrate (silicon wafer) as the first substrate 101, the TFT and wiring can be more finely processed by using an existing semiconductor process technology. For example, a TFT of several μm order can be formed. As described above, in the display device 1, by using the silicon substrate as the first substrate 101, the high-definition organic EL microdisplay can be implemented.

On the drive circuit layer 105, the light-emitting element layer 110 is formed with the insulating layer 107 interposed therebetween. Note that, the insulating layer 107 may include various known materials that can be used as an interlayer insulating layer in a general organic EL display. For example, the insulating layer 107 can include silicon oxide ($SiO_2$ or the like), SiN, insulating resin, or the like singly or in appropriate combination. Furthermore, a method of forming the insulating layer 107 is also not particularly limited, and for forming the insulating layer 107, a known method can be used, such as a CVD method, a coating method, a sputtering method, or various printing methods.

The light-emitting element layer 110 includes a first electrode 109, an organic layer 111 that functions as a light-emitting layer, and a second electrode 113 that are layered in this order on the insulating layer 107. For simplicity, although not illustrated, the first electrode 109 is patterned to be isolated from each other to correspond to each pixel. A layered structure of the first electrode 109, the organic layer 111, and the second electrode 113 in a portion corresponding to the isolated pattern can correspond to one light-emitting element (in other words, one pixel). For each pattern of the first electrode 109, the drive circuit is appropriately connected through a via (not illustrated) provided in the insulating layer 107, and the drive circuit appropriately applies a voltage to the first electrode 109, whereby each light-emitting element can be driven.

The organic layer 111 includes an organic light-emitting material, and is enabled to emit white light. A specific configuration of the organic layer 111 is not limited, and may be various known configurations. For example, the organic layer 111 may have: a layered structure of a hole transport layer, a light-emitting layer, and an electron transport layer; a layered structure of a hole transport layer and a light-emitting layer serving also as an electron transport layer; a layered structure of a hole injection layer, a hole transport layer, a light-emitting layer, an electron transport layer, and an electron injection layer; or the like. Furthermore, in a case where these layered structures and the like are "tandem units", the organic layer 111 may have a two-stage tandem structure in which a first tandem unit, a connection layer, and a second tandem unit are layered. Alternatively, the organic layer 111 may have a tandem structure of three or more stages in which three or more tandem units are layered. In a case where the organic layer 111 includes a plurality of tandem units, by changing emission color of the light-emitting layer in red, green, and blue for each tandem unit, the organic layer 111 can be obtained that emits white as a whole.

For example, the organic layer 111 is formed by vacuum evaporation of an organic material. However, the present embodiment is not limited to such an example, and the organic layer 111 may be formed by various known methods. An example of a method that can be used as a method of forming the organic layer 111 includes: a physical vapor deposition method (PVD method) such as a vacuum evaporation method; a printing method such as a screen printing method and an inkjet printing method; a laser transfer method that transfers an organic layer by separating the organic layer on a laser absorption layer formed on a transfer substrate by emitting a laser to a layered structure of the laser absorption layer and the organic layer; various coating methods; or the like.

The first electrode 109 functions as an anode. Since the display device 1 is of a top emission type, the first electrode 109 includes a material that can reflect light from the organic layer 111. For example, the first electrode 109 includes an alloy of aluminum and neodymium (Al—Nd alloy). Furthermore, a film thickness of the first electrode 109 is, for example, from about 0.1 μm to 1 μm. However, the present embodiment is not limited to such an example, and the first electrode 109 can include various known materials used as a material of a light reflection side electrode that functions as an anode in a general organic EL display device. Furthermore, the film thickness of the first electrode 109 is not limited to the above example, and the first electrode 109 can be appropriately formed within a range of the film thickness generally adopted in the organic EL display device.

For example, the first electrode 109 can include metal having a high work function, such as platinum (Pt), gold (Au), silver (Ag), chromium (Cr), tungsten (W), nickel (Ni), copper (Cu), iron (Fe), cobalt (Co), or tantalum (Ta), or an alloy (for example, an Ag—Pd—Cu alloy containing silver as a main component, palladium (Pd) of 0.3 mass % to 1 mass %, and copper of 0.3 mass % to 1 mass %, or an Al—Nd alloy). Alternatively, as the first electrode 109, a conductive material can be used having a low work function value and high light reflectance, such as aluminum or an alloy containing aluminum. In this case, it is preferable to improve the hole injection property by providing an appropriate hole injection layer or the like on the first electrode 109. Alternatively, the first electrode 109 may have a structure in which a transparent conductive material having excellent hole injection characteristics, such as an indium tin oxide (ITO) or an indium zinc oxide (IZO), is layered on a dielectric multilayer film, or a reflective film having high light reflectivity such as aluminum.

The second electrode 113 functions as a cathode. Since the display device 1 is of a top emission type, the second electrode 113 includes a material that can transmit light from the organic layer 111. For example, the second electrode 113 includes an alloy of magnesium and silver (Mg—Ag alloy). Furthermore, a film thickness of the second electrode 113 is, for example, about 10 nm. However, the present embodiment is not limited to such an example, and the second electrode 113 can include various known materials used as a material of a light transmission side electrode that functions as a cathode in a general organic EL display device. Furthermore, the thickness of the second electrode 113 is not limited to the above example, and the second electrode 113 can be appropriately formed within a range of the film thickness generally adopted in the organic EL display device.

For example, the second electrode 113 can include aluminum, silver, magnesium, calcium (Ca), sodium (Na), strontium (Sr), an alloy of an alkali metal and silver, an alloy of alkali-earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where these materials are used as a single layer, the film thickness of the second electrode 113 is, for example, from about 4 nm to 50 nm. Alternatively, the second electrode 113 may have a structure in which the above-described material layer and a transparent electrode (for example, from about 30 nm to 1 μm in thickness) including, for example, ITO or IZO are layered from the organic layer 111 side. In the case of such a layered structure, the thickness of the above-described material layer can also be reduced to, for example, from about 1 nm to 4 nm. Alternatively, the second electrode 113 may include only the transparent electrode. Alternatively, to the second electrode 113, a bus electrode (auxiliary electrode) may be provided including a low resistance material such as aluminum, an aluminum alloy, silver, a silver alloy, copper, a copper alloy, gold, a gold alloy, or the like, to achieve a low resistance of the second electrode 113 as a whole.

For example, the first electrode 109 and the second electrode 113 are formed by depositing a material with a predetermined thickness by a vacuum evaporation method, and then patterning the film by an etching method. However, the present embodiment is not limited to such an example, and the first electrode 109 and the second electrode 113 may be formed by various known methods. An example of a method of forming the first electrode 109 and the second electrode 113 includes: an evaporation method including an electron beam evaporation method, a hot filament evaporation method, and a vacuum evaporation method; a sputtering method; a chemical vapor deposition method (CVD method); a metal organic chemical vapor deposition method (MOCVD method); a combination of an ion plating method and an etching method; various printing methods (for example, a screen printing method, an inkjet printing method, a metal mask printing method, or the like); a plating method (an electroplating method, an electroless plating method, or the like); a lift-off method; a laser ablation method; a sol-gel method; or the like.

(Configuration of Second Substrate)

The second substrate 103 includes quartz glass. However, the present embodiment is not limited to such an example, and various known materials may be used as the second substrate 103. For example, the second substrate 103 can include various glass substrates, organic polymer substrates, or the like. However, since the display device 1 is of a top emission type, the second substrate 103 can include a material having high light transmittance that can suitably transmit the emitted light from the light-emitting element.

On the second substrate 103, the CF layer 117 is formed. A film thickness of the CF layer 117 is, for example, from about 0.5 μm to about 2.0 μm. In the CF layer 117, after the first substrate 101 and the second substrate 103 are bonded together, any of CFs of respective colors of RGB (the red CF 117R, the green CF 117G, and the blue CF 117B) is formed at a portion corresponding to each light-emitting element. That is, after the first substrate 101 and the second substrate 103 are bonded together, any one of the CF 117R, CF 117G, and CF 117B is arranged for one light-emitting element. Note that, in the following description, in a case where it is unnecessary to distinguish the CF 117R, CF 117G, and CF 117B from each other, one or more of them is also referred to simply as CF 117a.

For formation of the CF layer 117, various known materials and processes can be applied used for forming the CF in the image sensor. For example, the CF layer 117 can be formed by exposing and developing a resist material in a predetermined shape by a photolithography technology.

Figure 5:
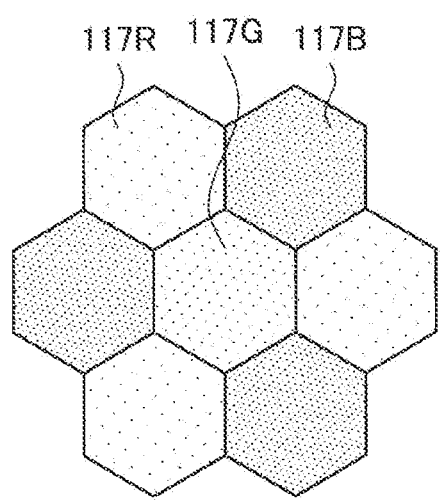
FIG. 5 is a top view illustrating an array of CFs in a delta array as an example of a method of arraying the CFs.
Figure 6:
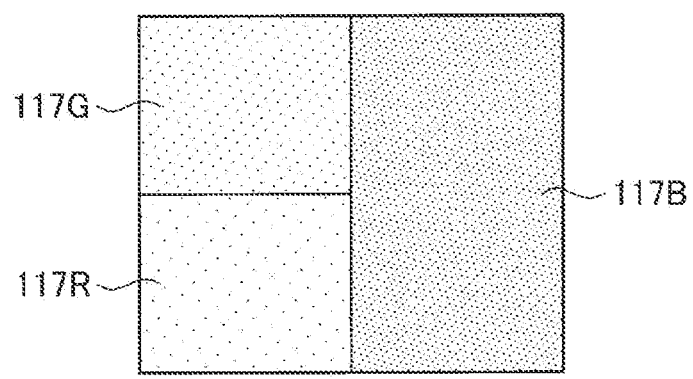
FIG. 6 is a top view illustrating the array of the CFs in a square array as another example of the method of arraying the CFs.

Note that, a method of arraying the CFs 117a is not limited. For example, the arraying method may be various known arraying methods such as a stripe array, a delta array, a square array, or the like. FIG. 5 is a top view illustrating an array of the CFs 117a in the delta array as an example of the method of arraying the CFs 117a. FIG. 6 is a top view illustrating the array of the CFs 117a in the square array as another example of the method of arraying the CFs 117a. In the square array, one pixel can include the red CF 117R corresponding to one sub-pixel, the green CF 117G corresponding to one sub-pixel, and the blue CF 117B corresponding to two sub-pixels.

A planarizing film 119 is layered on the CF layer 117. The planarizing film 119 includes a resin-based material (for example, a mixture of novolak and acrylic resin, acrylic resin, styrene resin, or the like).

Then, the ML layer 121 is formed on the planarizing film 119. In the ML layer 121, the MLs 121a are formed such that the MLs 121a are positioned at portions corresponding to respective CFs 117a of the CF layer 117. That is, one ML 121a is arranged for one CF 117a.

For example, in the present embodiment, each ML 121a can be formed in a shape that substantially inscribes the corresponding CF 117a as viewed from above. In this case, the adjacent MLs 121a are formed to be in contact with each other. However, the present embodiment is not limited to such an example, and the ML 121a does not have to be completely inscribed in the CF 117a as viewed from above, and it may be formed somewhat small. In this case, there is a gap between the adjacent MLs 121a; however, as a result of studies by the present inventors, even if such a gap exists, as long as the gap is within a predetermined range, it has been found that the ML 121a sufficiently performs a function of collecting the emitted light (details will be described below (4. Confirmation of effect)). Thus, in the present embodiment, as described above, even if each ML 121a is formed such that a gap exists between the MLs 121a, the gap is appropriately adjusted, whereby an effect can be obtained of improving the light extraction efficiency.

Note that, depending on the method of arraying the CFs 117a, the shape of each CF 117a differs as viewed from above, so that the shape of ML 121a also differs. For example, in the case of the delta array, the shape of the CF 117a is substantially a regular hexagon for each color. Thus, in this case, the shape of the ML 121a may be substantially a perfect circle, corresponding to the shape of the CF 117a. On the other hand, for example, in the case of the stripe array, the shape of the CF 117a is substantially rectangular for each color. Thus, in this case, the shape of the ML 121a may be substantially elliptical, corresponding to the shape of the CF 117a. Furthermore, the shape of the ML 121a is not limited to a circular shape, and may be a substantially square shape or a shape close to a square shape (a rectangle in which each vertex is rounded). Since it is considered that the shape of the optimum ML 121a that can obtain high light collection efficiency varies depending on the shape of the CF 117a, in other words, the shape of the pixel, the shape of the ML 121a may be appropriately determined in accordance with the shape of the CF 117a.

For formation of the ML layer 121 (in other words, formation of the ML 121a), for example, various known materials and processes can be applied used for forming the ML in the image sensor. For example, as the material of the ML layer 121, a melt flow type microlens resist material used in an image sensor is used, and the ML layer 121 can be formed through patterning by photolithography and the reflow step. Thus, on the second substrate 103, the ML 121a has a convex shape protruding toward the opposite side to the second substrate 103. Note that, details will be described later of methods of forming the planarizing film 119 and the ML layer 121.

In a state in which each layer up to the light-emitting element layer 110 is formed on the first substrate 101 as illustrated in FIG. 3 and each layer up to the ML layer 121 is formed on the second substrate 103, the first substrate 101 and the second substrate 103 are bonded together with an adhesive layer 115 including a filler interposed therebetween such that the ML layer 121 faces the light-emitting element layer 110. As a result, the display device 1 is produced. In this case, as described above, on the second substrate 103, since each ML 121a is formed to have a convex shape protruding toward the opposite side to the second substrate 103, each ML 121a has a lens shape (in other words, a concave lens shape) protruding toward each corresponding light-emitting element after the first substrate 101 and the second substrate 103 are bonded together.

Note that, as the filler of the adhesive layer 115, a material is used whose refractive index is lower than the refractive index of the ML layer 121. For example, in a case where the above-described melt flow type microlens resist material is used as the material of the ML layer 121, since the refractive index of the resist material is about 3.0, a resin-based material is used as the filler, for example, epoxy resin, acrylic resin, or the like whose refractive index is about 1.5.

The configuration has been described above of the display device 1 according to the present embodiment. As described above, the display device 1 is the facing CF type organic EL microdisplay, and the ML layer 121 is formed on the second substrate 103 on which the CF layer 117 is formed. Thus, even if the ML layer 121 is formed through a relatively high temperature reflow step, the step does not affect the light-emitting element of the light-emitting element layer 110. The ML layer 121 can therefore be formed by using existing materials and methods, for example, materials and methods used for the image sensor, and the like, so that the development cost can be significantly reduced. Furthermore, the CF layer 117 can also be formed by applying materials, methods, and the like used for the image sensor, for example, so that the development cost can be further reduced. As described above, according to the present embodiment, the display device 1 can be implemented in which the light extraction efficiency is improved by the ML layer 121 while the development cost is suppressed. Furthermore, the ML layer 121 is provided, whereby leakage of light into adjacent pixels is suppressed, so that the occurrence of color mixing can also be suppressed.

Note that, as a method of improving the light extraction efficiency in the facing CF type organic EL microdisplay such as the display device 1, it is conceivable to thin the CF layer. However, when the CF layer is simply thinned, chromaticity is decreased, and color reproducibility is degraded. With respect to such circumstances, in the present embodiment, the CF layer 117 is thinned to, for example, equal to or less than about 2.0 µm, and the ML layer 121 is also formed. As a result, the emitted light from each light-emitting element is collected by each ML 121a and passes through the CF 117a corresponding to the light-emitting element, so that the light extraction efficiency can be improved without degradation of the color reproducibility.

Furthermore, in formation of the ML layer 121 on the second substrate 103, if the ML layer 121 is formed by using an existing method, for example, the reflow or the like, the ML 121a has a shape protruding toward the opposite side to the second substrate 103. When the second substrate 103 on which the ML layer 121 is formed is bonded to the first substrate 101 such that the ML layer 121 faces the light-emitting element layer 110, the ML 121a resultantly has a concave lens shape. As described above, in the display device 1, the ML 121a having the concave lens shape can be easily formed by using the existing method.

Figure 7:
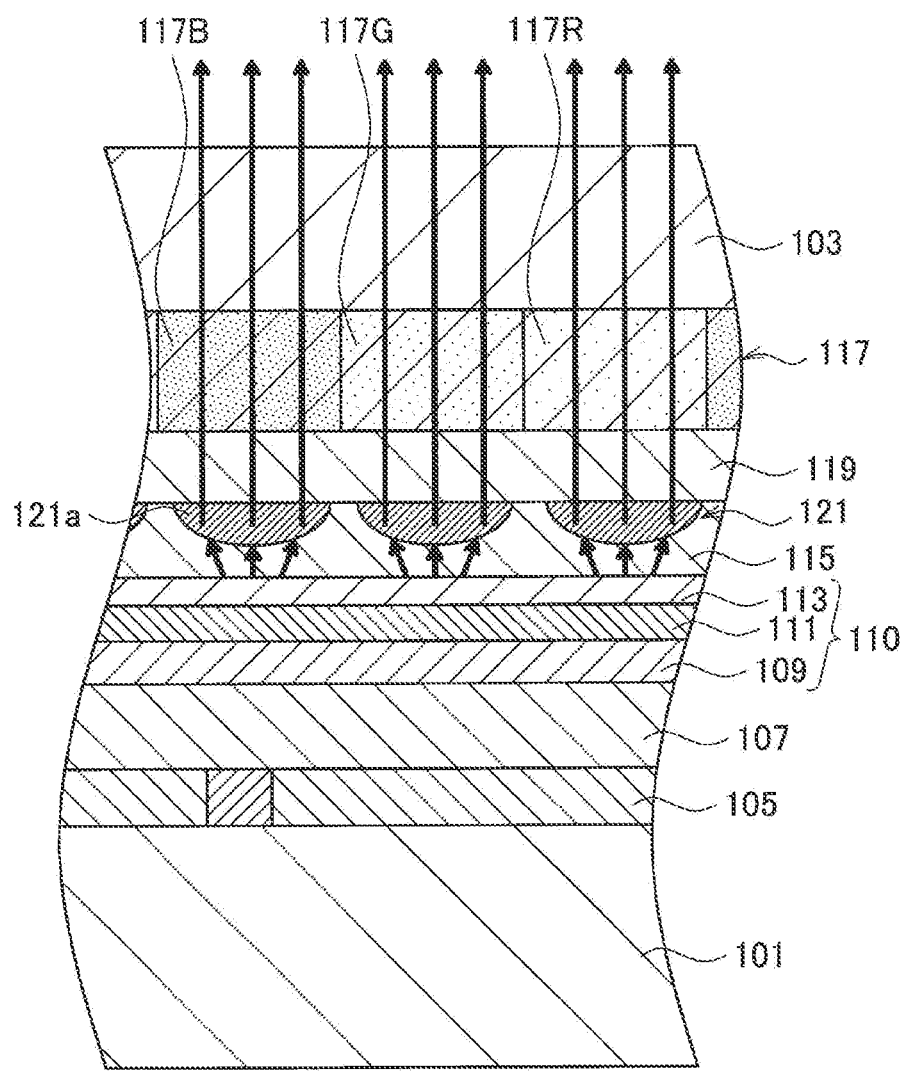
FIG. 7 is a diagram for explaining an effect of an ML in the display device according to the present embodiment.

At this time, in the present embodiment, the filler constituting the adhesive layer 115 and the material of the ML layer 121 are selected such that the refractive index of the adhesive layer 115 that is a layer between the light-emitting element and the ML 121a becomes lower than the refractive index of the ML 121a. Thus, the ML 121a having the concave lens shape is formed, whereby the light from the light-emitting element can be efficiently collected by the ML 121a as illustrated in FIG. 7. That is, the light extraction efficiency can be improved. FIG. 7 is a diagram for explaining an effect of the ML 121a in the display device 1 according to the present embodiment. In FIG. 7, a part of the display device 1 illustrated in FIG. 2 is extracted and illustrated, and a state is illustrated by arrows schematically in which the emitted light from a light-emitting element is collected by the ML 121a, and transmitted through the CF 117R, 117G, or 117B corresponding to the light-emitting element and the second substrate 103, and is extracted toward the outside.

Note that, generally, in the facing CF type organic EL display device, when the substrate on which the light-emitting element is formed and the substrate on which the CF is formed are bonded together, alignment accuracy between the light-emitting element and the CF can be a problem. To perform the alignment with high accuracy, it can be said that the OCCF method is preferable in which the light-emitting element and the CF are formed on the same substrate. However, in the case of the ultra-small organic EL display device, even with the facing CF method, the size of the panel is small, so that alignment of the light-emitting element and the CF can be performed with high accuracy as compared with a medium or larger organic EL display device, for example. As described above, since the display device 1 is the ultra-small organic EL display device, the alignment accuracy can be maintained between the light-emitting element and the CF 117a even if the display device 1 is produced by the facing CF method. In other words, the configuration of the above-described facing CF method organic EL display device can be suitably applied to the ultra-small organic EL display device such as the display device 1.

3. Method of Forming ML Layer

Figure 8:
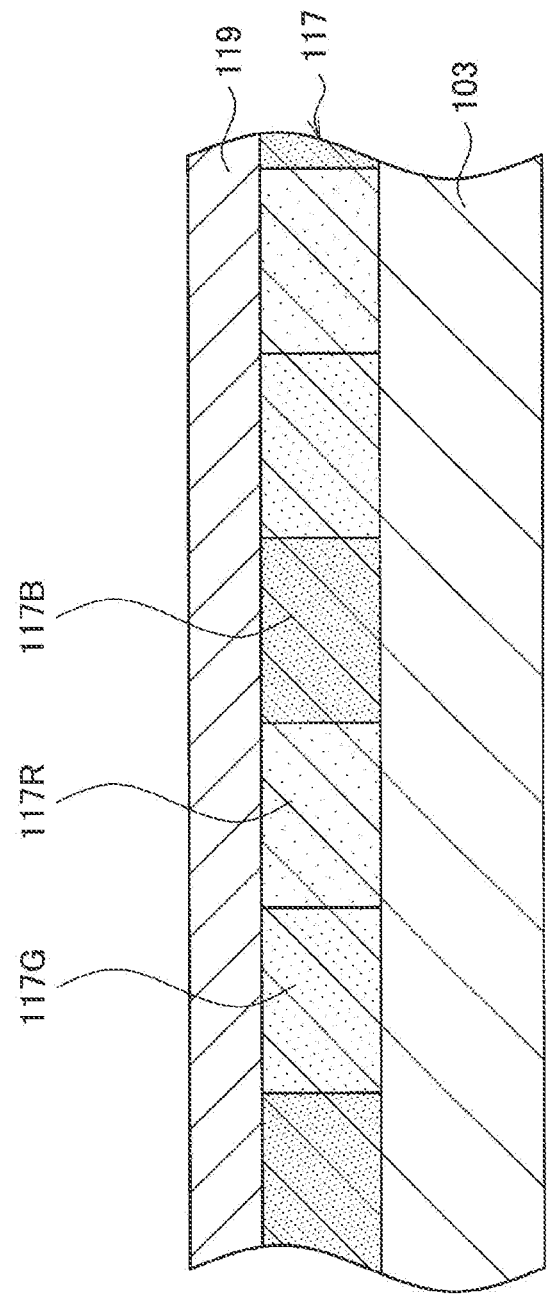
FIG. 8 is a diagram for explaining a method of forming an ML layer on the second substrate.
Figure 9:
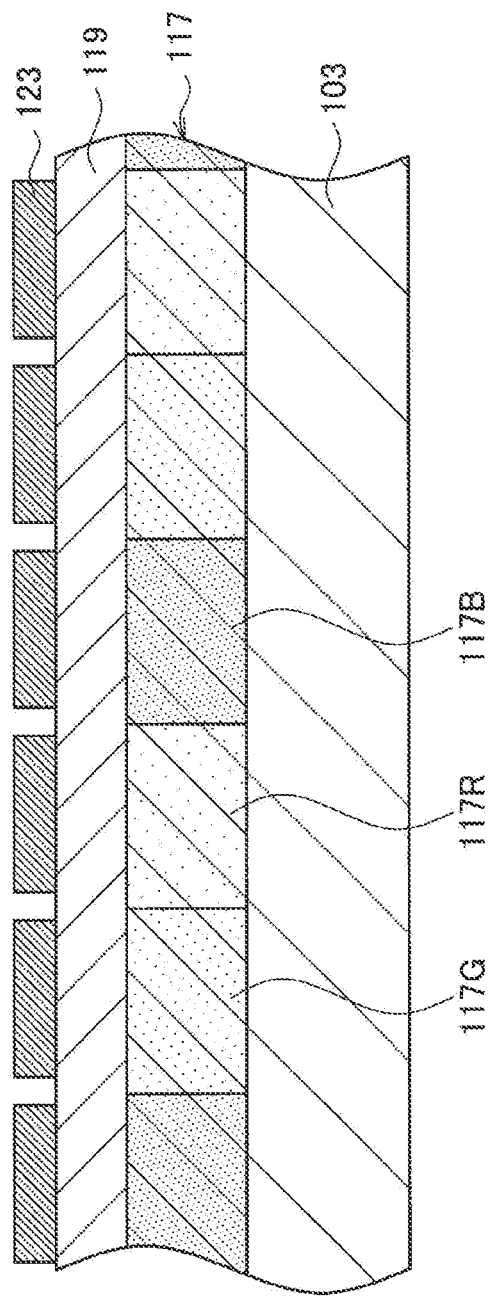
FIG. 9 is a diagram for explaining the method of forming the ML layer on the second substrate.
Figure 10:
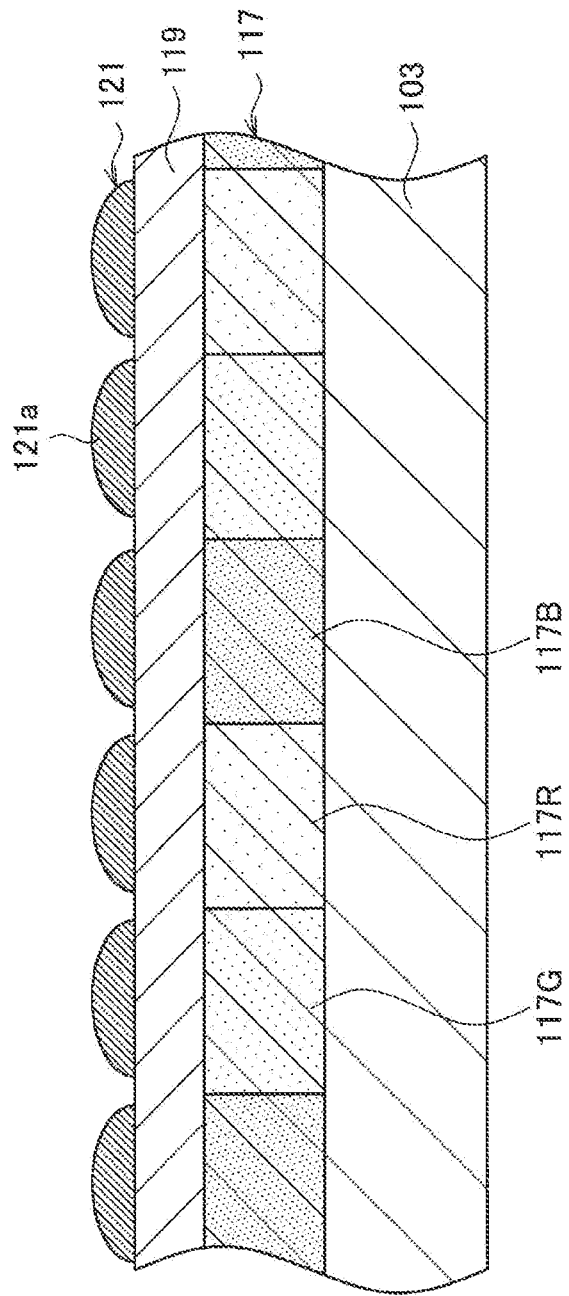
FIG. 10 is a diagram for explaining the method of forming the ML layer on the second substrate.

The method of forming the ML layer 121 on the second substrate 103 described above will be described in more detail with reference to FIGS. 8 to 10. FIGS. 8 to 10 are diagrams for explaining the method of forming the ML layer 121 on the second substrate 103. In FIGS. 8 to 10, a cross section parallel to the layering direction (vertical direction) of the configuration of the second substrate 103 is schematically illustrated in the order of steps in a producing method of the configuration, and a process flow in the producing method is represented.

As described above, when the CF layer 117 is formed on the second substrate 103, the planarizing film 119 is layered thereon (FIG. 8). A film thickness of the planarizing film 119 is, for example, equal to or less than about 10 µm. Furthermore, the planarizing film 119 includes a material having a refractive index of, for example, from about 1.0 to 2.5. An example of a material of the planarizing film 119 that can implement such a refractive index includes a mixture of novolak and acrylic resin, acrylic resin, styrene resin, or the like. Note that, in a case where the CF layer 117 is formed to have sufficient flatness, the planarizing film 119 does not have to be layered.

Next, a material (lens material) of the ML 121a is deposited on the planarizing film 119. Since a film thickness of the lens material is a factor that can determine a height and a curvature of the ML 121a, the film thickness is appropriately determined so that the shape of the ML 121a to obtain a desired light collection efficiency can be implemented. For example, the film thickness of the lens material can be appropriately determined within a range of 0.1 µm to 5.0 µm. Furthermore, as the lens material, a material used for the ML of the image sensor may be applied as it is. For example, as the lens material, the melt flow type microlens resist material used in the image sensor can be used. The refractive index of the resist material is about 3.0 as described above.

Next, with photolithography technology, a lens material 123 deposited is patterned by leaving only a portion where the ML 121a is formed (in other words, a portion directly above each CF 117a) (FIG. 9). Specifically, after an exposure step and a development step are performed, bleaching processing of a photosensitive material by UV light is performed. In the exposure step, for example, i-ray exposure is performed.

Note that, by adjusting a pattern of the lens material 123 in a patterning step of the lens material 123, it is possible to control the shape of the ML 121a after the formation as viewed from above, and the gap between the adjacent MLs 121a. The lens material 123 is patterned to obtain a desired shape of the ML 121a and a gap between the MLs 121a by predicting a change in shape in the reflow step as described later.

Next, the reflow is performed of the lens material 123 patterned, whereby the ML 121a (in other words, the ML layer 121) is formed (FIG. 10). The reflow temperature is from about 100° C. to 250° C. Furthermore, the reflow may also be performed by multi-stage heat treatment or temperature raising treatment.

Note that, after the ML 121*a* is formed, an oxide film may be formed on the surface thereof. For example, the oxide film can be deposited in a range of equal to or less than 1000 nm. The oxide film functions as a low reflection film that suppresses reflection of light at the ML 121*a*. Such an oxide film is provided, whereby a rate decreases at which the emitted light from the light-emitting element is reflected on the surface of the ML 121*a*, and the light extraction efficiency can be further improved.

The method of forming the ML layer 121 has been described above. Note that, in the above description, the ML layer 121 is formed by a so-called melt flow method using the reflow; however, in the present embodiment, the method of forming the ML layer 121 is not limited to such an example, and various known methods may be applied used in forming the ML in the image sensor generally. For example, the ML layer 121 may be formed by an etch back method. In the etch back method, after the lens material is deposited, resist reflecting the shape of the lens 121*a* (for example, a hemispherical shape) is formed thereon, and the lens 121*a* is formed by performing etch back.

4. Confirmation of Effect (4-1. Relationship Between ML Thickness and Light Extraction Efficiency)

Results will be described of an experiment conducted by the present inventors to confirm the effect of improving the light extraction efficiency by the display device 1 according to the present embodiment described above. In the experiment, a sample was produced of an organic EL microdisplay having a configuration similar to that of the display device 1 according to the present embodiment illustrated in FIG. 2, the sample was actually driven, and regarding light emitted from the display surface, values of X, Y, and Z in the CIE XYZ color system were measured (note that, the value of Y corresponds to luminance). In the sample, the pixel size was 7.8 μm×7.8 μm. The array of the CFs was the square array, and one pixel was formed by a total of four sub-pixels of one red sub-pixel, one green sub-pixel, and two blue sub-pixels. The ML layer was formed by the melt flow method. The gap between adjacent MLs was 1000 nm.

Figure 11:
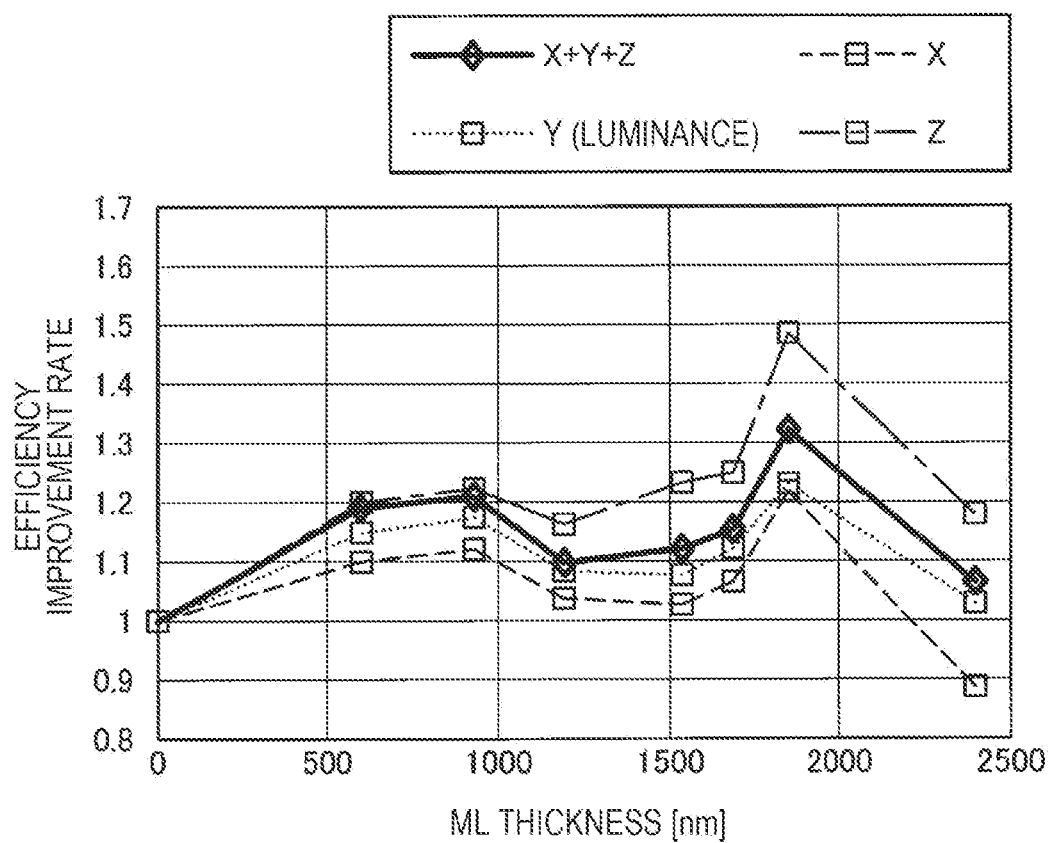
FIG. 11 is a diagram illustrating measurement results of values of X, Y, and Z in the CIE XYZ color system of emitted light, for an organic EL microdisplay according to the present embodiment.

In this experiment, a plurality of samples having mutually different thickness of the ML layer (in other words, the height of the ML. Hereinafter, also referred to as ML thickness) was produced, and the values of X, Y, and Z were measured for each of the samples. The results are illustrated in FIG. 11. FIG. 11 is a diagram illustrating measurement results of the values of X, Y, and Z in the CIE XYZ color system of the emitted light, for the organic EL microdisplay according to the present embodiment. In FIG. 11, the horizontal axis indicates the ML thickness, and the vertical axis indicates measured values of X, Y, and Z, and a relationship is plotted between the ML thickness and the measured value. Note that, as the value of the vertical axis, a relative value is plotted assuming that the value is 1 in a case where the ML layer is not provided. It can be said that the value of the vertical axis indicates an improvement rate (efficiency improvement rate) in the light extraction efficiency, with the value in the case where the ML layer is not provided, as a reference.

Referring to FIG. 11, it can be confirmed that the light extraction efficiency is improved by forming the ML layer, at least in a ML thickness range of equal to or less than about 2000 nm. In particular, in the samples used in this experiment, peaks were confirmed in the efficiency improvement rate at a point where the ML thickness was around 1000 nm and a point where the ML thickness was around 1800 nm. Specifically, focusing on white light emission (X+Y+Z), it was confirmed that the light extraction efficiency was improved by 1.2 times and 1.3 times, respectively, at the point where the ML thickness was around 1000 nm and the point where the ML thickness was around 1800 nm, as compared with the case where the ML layer was not provided. The results indicate that the light extraction efficiency has dependence on the ML thickness, and the peaks exist at specific ML thicknesses. From the results, when producing the display device 1 according to the present embodiment, considering the relationship between the light extraction efficiency and the ML thickness, the ML layer is designed so that its thickness is an appropriate value, whereby the light extraction efficiency can be further improved.

Furthermore, as illustrated in FIG. 11, in the samples used in this experiment, a significant decrease was seen in the values of X, Y, and Z at a point where the ML thickness was around 2400 nm. In particular, the value of X was lower than that in the case where the ML layer was not provided. The results indicate that when the ML thickness becomes too large, it is difficult to obtain the effect of improving the light extraction efficiency, and the light extraction efficiency rather decreases depending on the color of the emitted light. The results indicate that in the display device 1 according to the present embodiment, by designing the ML layer considering such an upper limit of the ML thickness for each color of light emission, the light extraction efficiency can be more efficiently improved.

(4-2. Relationship Between Gap Between MLs and Light Extraction Efficiency)

Results will be described of an experiment conducted by the present inventors to confirm influence of the gap between the adjacent MLs 121*a* on the light extraction efficiency in the display device 1 according to the present embodiment. In the experiment, a sample was produced of an organic EL microdisplay having a configuration similar to that of the display device 1 according to the present embodiment illustrated in FIG. 2, the sample was actually driven, and regarding light emitted from the display surface, luminance was measured. In the sample, the pixel size was 7.8 μm×7.8 μm. The array of the CFs was the square array, and one pixel was formed by a total of four sub-pixels of one red sub-pixel, one green sub-pixel, and two blue sub-pixels. The ML layer was formed by the melt flow method.

Figure 12:
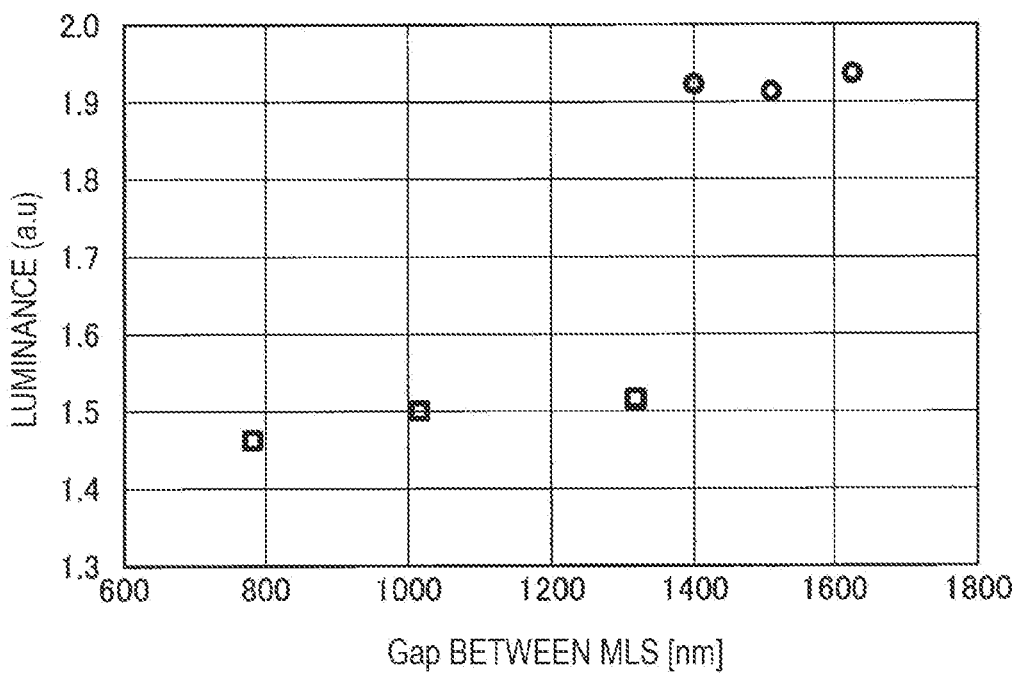
FIG. 12 is a diagram illustrating measurement results of luminance of the emitted light, for the organic EL microdisplay according to the present embodiment.

In this experiment, a plurality of samples having mutually different gaps between the MLs was produced, and the luminance was measured for each of the samples. The results are illustrated in FIG. 12. FIG. 12 is a diagram illustrating measurement results of the luminance of the emitted light of the organic EL microdisplay according to the present embodiment. In FIG. 12, the horizontal axis indicates the gap between the MLs, the vertical axis indicates a measured value of the luminance, and a relationship is plotted between the gap and the measured value. Furthermore, in this experiment, for each sample having a predetermined gap between the MLs, samples were also produced in which the shape of the ML was changed as viewed from above, and the luminance was similarly measured also for these samples. In FIG. 12, as an example of the experiment results, a result for a sample whose ML shape is substantially square is plotted with a square marker, and a result for a sample whose ML shape is substantially a perfect circle is plotted with a circle marker.

Referring to FIG. 12, in both of the sample whose ML shape is substantially square and the sample whose ML shape is substantially the perfect circle, it can be confirmed that the luminance does not substantially change even if the gap between the MLs is changed. The results indicate that the light extraction efficiency does not substantially change even if the gap between the MLs is changed within a predetermined range. However, although not illustrated in FIG. 15, if the gap between the MLs becomes too large, the size of the ML in the plane decreases accordingly, so that it becomes difficult for the emitted light from the light-emitting element to enter the ML, and it is considered that the luminance decreases. From the results, when producing the display device 1 according to the present embodiment, it is important to design the ML layer to cause the gap between the MLs to fall within an appropriate range in which the effect of improving the light extraction efficiency can be reliably obtained, by considering the relationship between the light extraction efficiency and the gap between the MLs.

5. Application Examples

An application example will be described of the display device 1 according to the present embodiment described above. Here, some examples will be described of an electronic device to which the above-described display device 1 can be applied.

Figure 13:
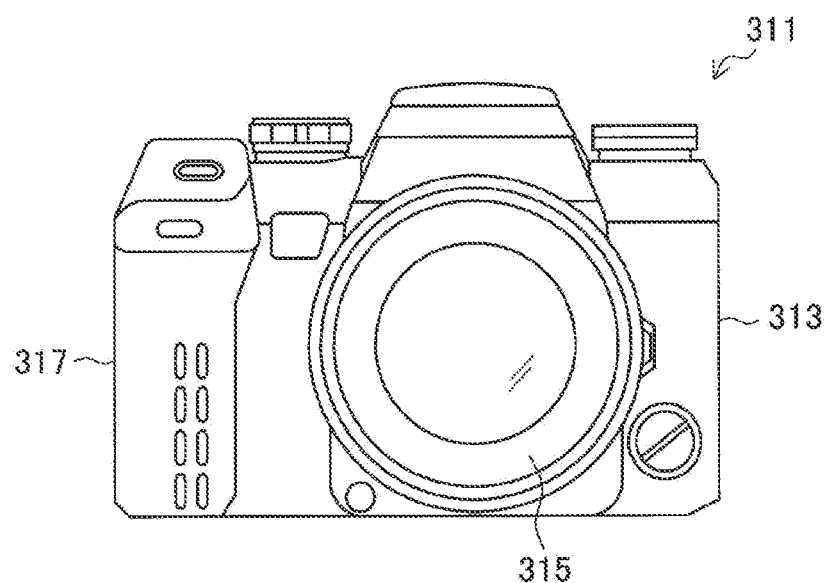
FIG. 13 is a diagram illustrating an appearance of a digital camera that is an example of an electronic device to which the display device according to the present embodiment can be applied.
Figure 14:
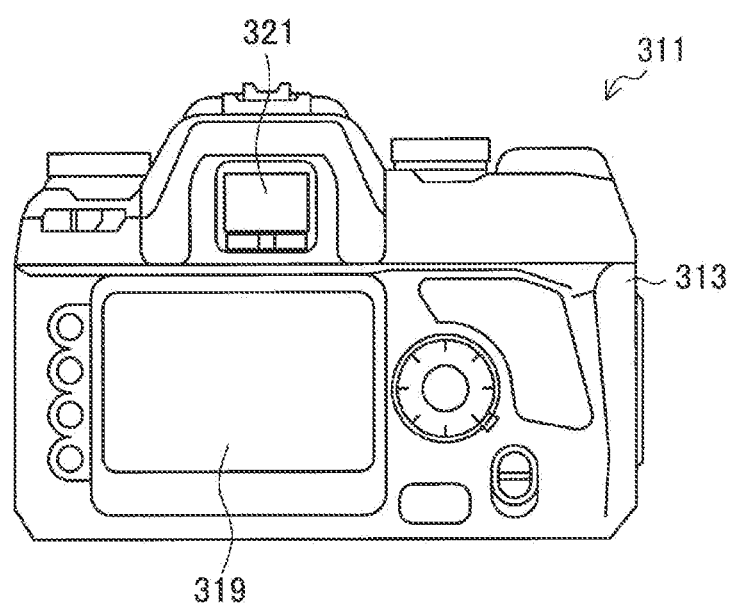
FIG. 14 is a diagram illustrating an appearance of the digital camera that is the example of the electronic device to which the display device according to the present embodiment can be applied.

FIGS. 13 and 14 are diagrams each illustrating an appearance of a digital camera that is an example of the electronic device to which the display device 1 according to the present embodiment can be applied. FIG. 13 illustrates the appearance of the digital camera viewed from the front (subject side), and FIG. 14 illustrates the appearance of the digital camera viewed from the back. As illustrated in FIGS. 13 and 14, a digital camera 311 includes a main body (camera body) 313, an interchangeable lens unit 315, a grip 317 gripped by a user at the time of photographing, a monitor 319 that displays various kinds of information, and an EVF 321 that displays a through image to be observed by the user at the time of photographing. The EVF 321 can include the display device 1 according to the present embodiment.

Figure 15:
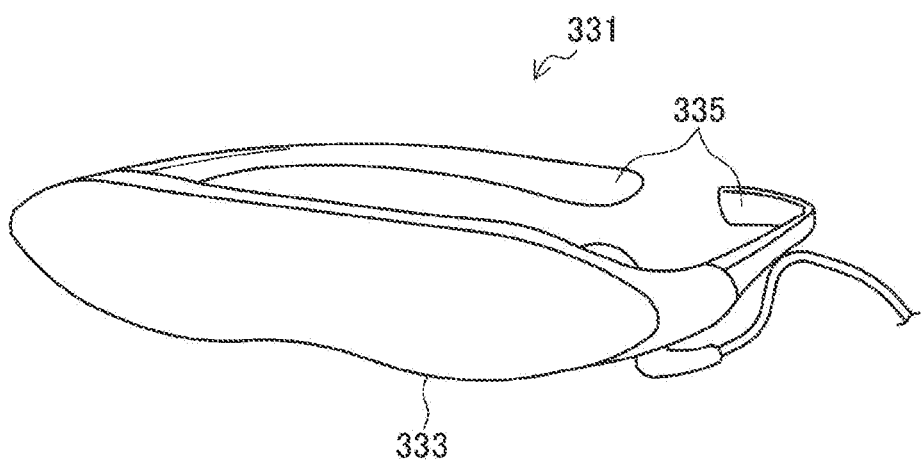
FIG. 15 is a diagram illustrating an appearance of an HMD that is another example of the electronic device to which the display device according to the present embodiment can be applied.

FIG. 15 is a diagram illustrating an appearance of an HMD that is another example of the electronic device to which the display device 1 according to the present embodiment can be applied. As illustrated in FIG. 15, an HMD 331 includes a glasses-shaped display unit 333 that displays various kinds of information, and an ear hook unit 335 to be hooked to the user's ear at the time of wearing. The display unit 333 can include the display device 1 according to the present embodiment.

Some examples have been described above of the electronic device to which the display device 1 according to the present embodiment can be applied. Note that, the electronic device to which the display device 1 can be applied is not limited to those exemplified above, and the display device 1 can be applied as a display device of any electronic device, as long as it is an electronic device on which a so-called microdisplay can be mounted, for example, a glasses-shaped wearable device, or the like.

6. Supplement

The preferred embodiments of the present disclosure have been described above in detail with reference to the accompanying drawings; however, the technical scope of the present disclosure is not limited to such examples. It is obvious that persons having ordinary knowledge in the technical field of the present disclosure can conceive various modification examples or correction examples within the scope of the technical idea described in the claims, and it is understood that the modification examples or correction examples also belong to the technical scope of the present disclosure.

For example, in the above embodiment, in the display device 1, one ML 121a is arranged for one pixel; however, the technology according to the present disclosure is not limited to such an example. For example, the plurality of MLs 121a may be arranged for one pixel.

Furthermore, for example, in the above embodiment, the display device 1 is an organic EL microdisplay; however, the technology according to the present disclosure is not limited to such an example. For example, the display device according to the present disclosure may be a small organic EL display device. In a case where the display device according to the present disclosure is the small organic EL display device, the display device can be mounted as a monitor of an electronic device such as a smartphone, a tablet PC, a digital camera, an electronic book, a personal digital assistant (PDA), or a game device. The display device according to the present disclosure can also be applied to a display device mounted on an electronic device in any field in which display is performed on the basis of an image signal input from the outside or an image signal generated in the inside.

Furthermore, the effects described in the present specification are merely illustrative or exemplary and not restrictive. That is, the technology according to the present disclosure can exhibit other effects obvious to those skilled in the art from the description of the present specification together with the above-described effects or in place of the above effects.

Note that, the following configurations also belong to the technical scope of the present disclosure.

(1)

A display device including:

a first substrate that is a silicon substrate and on which a plurality of light-emitting elements is formed;

a second substrate including, on a surface, a color filter layer including a plurality of color filters arrayed and a microlens layer including a plurality of microlenses arrayed that are layered in this order, the microlens layer being arranged to face the plurality of light-emitting elements with respect to the first substrate; and an adhesive layer that fills a gap between the first substrate and the second substrate for bonding the first substrate and the second substrate together.

(2)

The display device according to (1), in which each of the microlenses has a convex shape protruding toward a corresponding one of the light-emitting elements.

(3)

The display device according to (1) or (2), in which a refractive index of a material of the adhesive layer is smaller than a refractive index of a material of the microlens layer.

(4)

The display device according to any one of (1) to (3), in which the display device is a microdisplay having a panel size of about 0.2 inches to about 2 inches.

(5)

The display device according to any one of (1) to (4), in which a pixel size of the display device is equal to or less than about 20 μm.

(6)

The display device according to any one of (1) to (5), in which an array of the color filters is a square array.

(7)

The display device according to any one of (1) to (5), in which an array of the color filters is a delta array.

(8)

The display device according to any one of (1) to (7), in which a shape of each of the microlenses as viewed from a layering direction is substantially a perfect circle.

(9)

The display device according to any one of (1) to (7), in which a shape of each of the microlenses as viewed from a layering direction is substantially square shape.

(10)

An electronic device including a display device that performs display on the basis of an image signal, in which the display device includes a first substrate that is a silicon substrate and on which a plurality of light-emitting elements is formed, a second substrate including, on a surface, a color filter layer including a plurality of color filters arrayed and a microlens layer including a plurality of microlenses arrayed that are layered in this order, the microlens layer being arranged to face the plurality of light-emitting elements with respect to the first substrate, and an adhesive layer that fills a gap between the first substrate and the second substrate for bonding the first substrate and the second substrate together.

(11)

A method of manufacturing a display device, including:

forming a plurality of light-emitting elements on a first substrate that is a silicon substrate;

layering, on a second substrate, a color filter layer including a plurality of color filters arrayed and a microlens layer including a plurality of microlenses arrayed, in this order; and bonding the first substrate and the second substrate together to cause the microlens layer to face the plurality of light-emitting elements.

REFERENCE SIGNS LIST 1, 2 Display device
101, 201 First substrate
103, 203 Second substrate
105, 205 Drive circuit layer
107, 207 Insulating layer
109, 209 First electrode
110, 210 Light-emitting element layer
111, 211 Organic layer
113, 213 Second electrode
115 Adhesive layer
117, 217 CF layer
119 Planarizing film
121 ML layer
121a ML
123 Lens material
215 Protective film
219 Sealing resin film

The invention claimed is:

1. A display device comprising:
a first substrate on which a plurality of light-emitting elements is formed;
a second substrate including, on a surface, a color filter layer including a plurality of color filters arrayed, a planarizing layer formed on the color filter layer, and a microlens layer formed on the planarizing layer, the microlens layer including a plurality of microlenses arrayed, the microlens layer being arranged to face the plurality of light-emitting elements with respect to the first substrate; and
an adhesive layer that fills a gap between the first substrate and the second substrate for bonding the first substrate and the second substrate together, wherein
each of the microlenses has a convex shape protruding toward a corresponding one of the light-emitting elements, and
a refractive index of a material of the adhesive layer is smaller than a refractive index of a material of the microlens layer.

2. The display device according to claim 1, wherein a pixel size of the display device is equal to or less than 20 μm.

3. The display device according to claim 1, wherein an array of the color filters is a square array.

4. The display device according to claim 1, wherein an array of the color filters is a delta array.

5. The display device according to claim 1, wherein a shape of each of the microlenses as viewed from a layering direction is circular.

6. The display device according to claim 1, wherein a shape of each of the microlenses as viewed from a layering direction is a square shape.

7. An electronic device comprising
a display device that performs display on a basis of an image signal, wherein
the display device includes
a first substrate on which a plurality of light-emitting elements is formed,
a second substrate including, on a surface, a color filter layer including a plurality of color filters arrayed, a planarizing layer formed on the color filter layer, and a microlens layer formed on the planarizing layer, the microlens layer including a plurality of microlenses arrayed, the microlens layer being arranged to face the plurality of light-emitting elements with respect to the first substrate, and
an adhesive layer that fills a gap between the first substrate and the second substrate for bonding the first substrate and the second substrate together, wherein
each of the microlenses has a convex shape protruding toward a corresponding one of the light-emitting elements, and
a refractive index of a material of the adhesive layer is smaller than a refractive index of a material of the microlens layer.

8. The electronic device according to claim 7, wherein a pixel size of the display device is equal to or less than 20 μm.

9. The electronic device according to claim 7, wherein an array of the color filters is a square array.

10. The electronic device according to claim 7, wherein an array of the color filters is a delta array.

11. The electronic device according to claim 7, wherein a shape of each of the microlenses as viewed from a layering direction is circular.

12. The electronic device according to claim 7, wherein a shape of each of the microlenses as viewed from a layering direction is a square shape.

13. The electronic device according to claim 7, wherein the planarizing layer includes a material having a refractive index of 1.0 to 2.5.

14. The electronic device according to claim 7, wherein a film thickness of the planarizing layer is equal to or less than 10 μm.

15. The display device according to claim 1, wherein the planarizing layer includes a material having a refractive index of 1.0 to 2.5.

16. The display device according to claim 1, wherein a film thickness of the planarizing layer is equal to or less than 10 μm.

\* \* \* \* \*